(12) United States Patent
Lin

(10) Patent No.: US 7,640,462 B2
(45) Date of Patent: Dec. 29, 2009

(54) INTERLEAVER AND DE-INTERLEAVER

(75) Inventor: Xiaotong Lin, San Jose, CA (US)

(73) Assignee: Agere Systems Inc., Allentown, PA (US)

( * ) Notice: Subject to any disclaimer, the term of this patent is extended or adjusted under 35 U.S.C. 154(b) by 424 days.

(21) Appl. No.: 10/592,882

(22) PCT Filed: Apr. 9, 2004

(86) PCT No.: PCT/US2004/011097

§ 371 (c)(1),
(2), (4) Date: May 18, 2007

(87) PCT Pub. No.: WO2005/109653

PCT Pub. Date: Nov. 17, 2005

(65) Prior Publication Data

US 2007/0266274 A1 Nov. 15, 2007

(51) Int. Cl.
*G06F 11/00* (2006.01)
(52) U.S. Cl. .................................... 714/701
(58) Field of Classification Search .............. 714/701, 714/746
See application file for complete search history.

(56) References Cited

U.S. PATENT DOCUMENTS 5,907,560 A * 5/1999 Spruyt ..................... 714/701
6,158,026 A * 12/2000 Kawahara ................. 714/701
6,392,572 B1 5/2002 Shiu et al. ................. 341/81
6,823,488 B1 * 11/2004 Heegard et al. ............ 714/786
6,973,611 B2 12/2005 Dabak et al. .............. 714/755
7,421,034 B2 * 9/2008 Cameron et al. ........... 375/265

FOREIGN PATENT DOCUMENTS

EP 0 674 395 A2 9/1995
EP 1 100 204 A1 5/2001
EP 1 359 672 A1 11/2003

* cited by examiner

*Primary Examiner*—Shelly A Chase
(74) *Attorney, Agent, or Firm*—Mendelsohn, Drucker, & Associates, P.C.; Kevin M. Drucker; Steve Mendelsohn

(57) ABSTRACT

An interleaver employs a generalized method of generating a mapping. The mapping is generated for interleaving bits of a data block and associated error detection/correction information. The data block is of length N, and the length of the error detection/correction information is P. An $(N+P)\times(N+P)$ square matrix is formed and divided into sub-blocks, where one portion of the matrix is associated with error detection/correction information and another portion is associated with data of the data block. New positions in the matrix are generated in a time sequence on a sub-block by sub-block basis based on a generator seed pair and an original position seed pair. The time sequence also corresponds to positions in an output interleaved block. Once the new position sequence is generated, the matrix is populated with data and error detection/correction information based on the corresponding time sequence. A de-interleaver performs the inverse mapping of the interleaver.

24 Claims, 7 Drawing Sheets

| i\j | 0 | 1 | 2 | 3 |
|---|---|---|---|---|
| 0 | N | p1 | p2 | p3 |
| 1 | p4 | b1 | b4 | b6 |
| 2 | p5 | b8 | b2 | b5 |
| 3 | p6 | b7 | b9 | b3 |

FIG. 4

| i\j | 0 | 1 | 2 | 3 |
|---|---|---|---|---|
| 0 | 0 | 4 | 8 | 12 |
| 1 | 13 | 1 | 5 | 9 |
| 2 | 10 | 14 | 2 | 6 |
| 3 | 7 | 11 | 15 | 3 |

FIG. 5

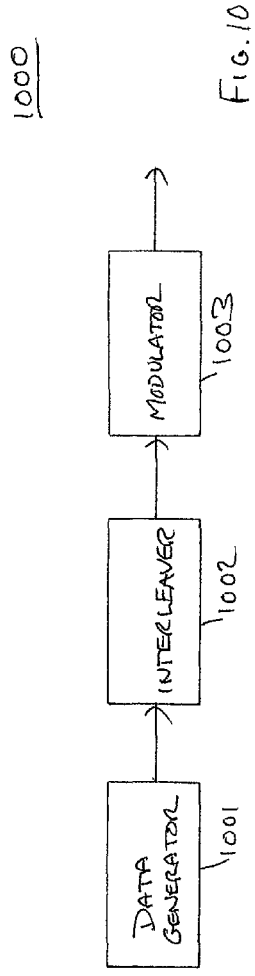
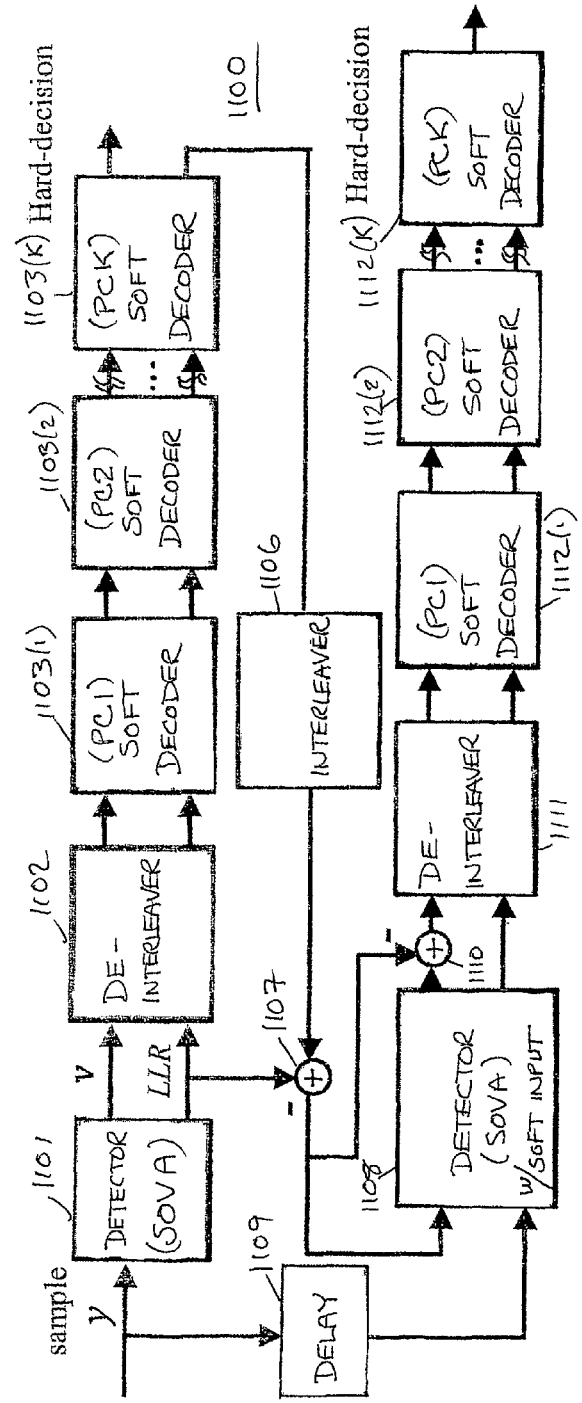

INTERLEAVER AND DE-INTERLEAVER

BACKGROUND OF THE INVENTION

1. Field of the Invention

The present invention relates to encoding, detection, and decoding of data in communication systems, and, more particularly, to an interleaver and de-interleaver for product code error detection and correction by a receiver.

2. Description of the Related Art

Many digital transmission systems commonly employ techniques for detection of digital data represented by a sequence of symbols. The symbol bits are transferred as a signal through a transmission (i.e., communication) channel in which noise is typically added to the transmitted signal. For example, magnetic recording systems first encode data into symbol bits that are recorded on a magnetic medium. Writing data to, storing data in, and reading data from the magnetic medium may be considered to take place via a transmission channel that has an associated frequency response. Similarly, wired, optical, wireless, and cellular communication systems also transfer encoded data through a channel, which encoded data is then detected and decoded by a receiver. The signal may be read from the channel as a sampled signal (i.e., a sequence of sample values) representing the transmitted encoded data. For processing convenience, the encoding and decoding process is applied to blocks of data, each block representing a portion of the original data sequence.

Encoding data with two-dimensional or higher block codes and subsequent decoding of the encoded data are employed in many systems due to the relatively high coding gain and simple structure of the decoder. Product codes may be employed for encoding of data in which two or more simple codes (known as component codes) are combined to create more powerful encoding schemes. The dimension of the code may be related to the number of component codes.

For example, a product code may employ a parity-bit check code that, for the two-dimensional case, encodes N information bits as two-dimensional data words (e.g., $n_1$ words having $n_2$ information bits, or $n_2$ words having $n_1$ information bits). Each data word represents a vector in a corresponding dimension, and $n_1$ and $n_2$ are integers greater than 0. The product code encoding of the data (i.e., the N information bits) are ordered in a rectangular matrix u, and the encoding may be a row vector (e.g., $n_2$ information bits) by column vector (e.g., $n_1$ information bits) combination to form the rectangular matrix u. The combination may be Galois field (GF)(2) addition, multiplication, or linear operation of the binary values. For example, a sequence of N information bits (e.g., a block of data) may be formed as an $(n_1 \times n_2)$ matrix of information bits, with $N=n_1 n_2$. The product code encoding of the data also includes row- and column-wise parity bits $p^r$ and $p^c$, respectively, as error detection and correction information. Horizontal rows are formed from $n_2$ code words of an $(n_1, k_1)$ block code $C^r$ having rate $R_1=(n_1/k_1)$ (here, $k_1$ is the total length of a row, and the length of the parity bit information for each row is $k_1-n_1$). Vertical columns are formed from $n_1$ code words of an $(n_2, k_2)$ block code $C^c$ having rate $R_2=(n_2/k_2)$ (here, $k_2$ is the total length of a column, and the length of the parity bit information for each column is $k_2-n_2$).

The block of data encoded with the product code is typically transmitted as a serial block of encoded data. Product codes typically exhibit optimum performance with respect to coding gain when correcting for single one-bit errors when single-bit parity check codes are employed on a per dimension basis. Only single, one-bit errors may be detected and corrected because of parity-check cancellation arising from an even number of errors occurring in a row or in a column and parity-check positional ambiguities associated with multiple one-bit errors. For an example of this positional ambiguity in a square, product code matrix with single-bit parity check codes, let the first element of the first row be in error, and the second element of the second row be in error (errors along the forward diagonal). Both the first and second row-wise and first and second column-wise parity bits will indicate an error, but they will also indicate an error if the second element of the first row and the first element of the second row is in error (errors in the reverse diagonal). Availability of soft information may aide in soft decoding to distinguish this type of ambiguity.

Detection and correction of higher numbers of errors, especially higher numbers of consecutive errors, may add excessive overhead in terms of error detection information (e.g., parity bits), reducing overall system throughput. Errors in data at the receiver may be caused by incorrect decisions of the detection and/or decoding process because of signal degradation. Signal degradation occurs from added random and/or burst noise as the signal passes through the communication channel.

For some product codes, the resulting output sequence may include symbol patterns that are particularly susceptible to detection error. For example, a sequence of all "1's may be difficult to detect if the receiver's sample timing is out of phase with the sequence symbol timing. Consequently, an interleaver design might include logic that avoids these patterns.

A characteristic of some communication channels is the addition of "bursty" noise. Such noise may corrupt a transmitted signal for a period of time equivalent to the period of several transmitted symbols (either data or encoded data). Bursty noise may cause burst errors in the received data. To minimize the effect of burst errors, many communication systems include an interleaver in the transmitter and a corresponding de-interleaver in the receiver. Interleaving is a mapping f(*) that generally comprises receiving a block of data having BLK values (i.e., BLK is the block length and BLK is an integer greater than one), and rearranging the order of the BLK values in the block. Interleaving may also be employed, for example, to remove non-random sequences of values in a data stream. By interleaving the symbols in a block of data prior to transmission through the channel, the de-interleaving process distributes the burst errors throughout the de-interleaved block.

The term "output channel sample" refers to a sample of encoded data from the transmission channel generated through the sampling process of the receiver. A receiver typically includes a detector to detect the sequence of symbol bits representing the encoded data from the output channel samples. A decoder receives the detected symbol sequence from the detector and decodes the sequence of symbol bits to reconstruct the data. The decoder may be a simple decoder reversing the encoding process, or an iterative decoder that repetitively decodes the data until a predetermined decoding metric, such as a maximum bit-error rate (BER) threshold, is satisfied. The detector may typically employ a partial response, maximum-likelihood (PRML) algorithm (e.g., Viterbi algorithm (VA)), a maximum a posterior (MAP) algorithm, or a soft-output Viterbi algorithm (SOVA). The decoder may typically use the soft information generated from the detector and employ soft decoding schemes.

These algorithms used by detectors and/or decoders typically determine a maximum-likelihood path through a trellis of states. The path represents a sequence of decisions for symbols corresponding to the received output channel samples. However, in situations where the received signal has low signal-to-noise ratio (SNR), the algorithm may determine an incorrect path through the trellis, thereby generating an incorrect sequence of decisions for a corresponding sequence of output channel samples. Such sequence of errors is commonly termed an "error event" of the detection algorithm. For some error events, the decision for the sequence of received bits may generate a long sequence of errors, which are thus inserted into the detected encoded data prior to decoding. Some detection algorithms used in a particular implementation are optimized based on channel memory, SNR, and impulse response, and indirectly with respect to dominant error events.

Consequently, an interleaver should have good performance for i) single error event detection and correction, ii) multiple error event detection and correction, and iii) avoidance of typical product code error patterns.

SUMMARY OF THE INVENTION

In accordance with the present invention, an interleaver employs a generalized method of generating a mapping. The mapping is generated for interleaving bits of a data block and associated error detection/correction information. A matrix is formed and divided into sub-blocks, where one portion of the matrix is associated with error detection/correction information and another portion is associated with data of the data block. The matrix has D dimensions, D an integer greater than 1, dimension d has length $(N_d+P_d)$, where $P_d$ is a positive integer, and the data block has length $$\prod_{d=1}^{D} N_d.$$

Positions in the matrix are generated in a time sequence on a sub-block by sub-block basis based on a generator seed set and an original position seed set. Each generator seed set value is selected so as to be relatively unique so as to be relatively prime with respect to a corresponding sub-block dimension length. The time sequence also corresponds to positions in an output interleaved block. Once the sequence of positions is generated, the matrix is populated with data and error detection/correction information based on the time sequence. A de-interleaver performs the inverse mapping of the interleaver.

BRIEF DESCRIPTION OF THE DRAWINGS

Other aspects, features, and advantages of the present invention will become more fully apparent from the following detailed description, the appended claims, and the accompanying drawings in which:

FIG. 4 shows an exemplary matrix formed in accordance with the method of FIG. 1 where N is three and P is one;

FIG. 5 shows an exemplary new matrix formed for the matrix of FIG. 4 including the time sequence and associated positions;

FIG. 10 shows a transmitter including an interleaver operating in accordance with an exemplary embodiment of the present invention; and FIG. 11 shows a receiver including an interleaver and de-interleaver operating in accordance with an exemplary embodiment of the present invention.

DETAILED DESCRIPTION

Figure 1:
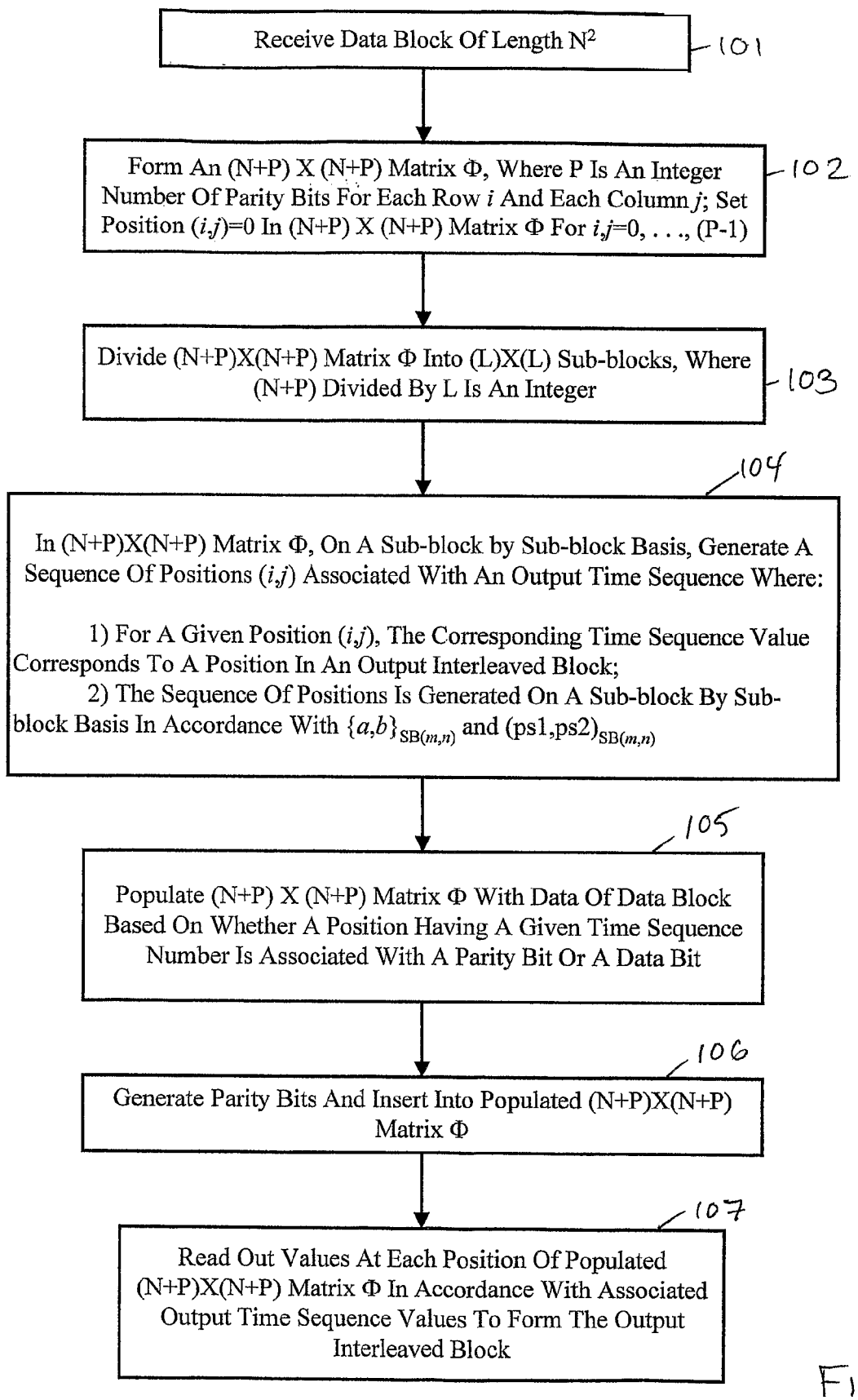
FIG. 1 shows a method of interleaving in accordance with an exemplary embodiment of the present invention.

FIG. 1 shows a method of interleaving in accordance with an exemplary embodiment of the present invention. Method 100 comprises steps 101 through 107. Steps 101 through 104 might be employed by a designed to generate a mapping for an exemplary interleaver implementation, while steps 105 through 107 might be employed by the exemplary interleaver implementation during operation. A given implementation of a de-interleaver operating in accordance with an exemplary embodiment of the present invention might employ a reverse mapping of the corresponding interleaver mapping (called an inverse mapping). An inverse mapping is readily generated given a mapping generated in accordance with an exemplary embodiment of the present invention.

At step 101, the method receives a block of data (input data block) having a length of NM, where N and M are positive integers greater than 1. For the exemplary embodiment of FIG. 1, $N=M=N^2$ and the method employs two-dimensional matrices. The block of data is a sequence of values, where each value has a corresponding position in the sequence. The position might be indicated by a numerical value, which might also be associated with a unit of time (e.g., the value at position 4 is received at T=4). The data block might be generated from user data by encoding with product codes, and such encoding might be incorporated into practice of the present invention.

At step 102, method 100 forms a square matrix $\Phi$ of size (N+P) by (N+P), or (N+P)×(N+P), where P is a positive integer greater than 0. P rows and P columns of the matrix $\Phi$ are desirably associated with error detection and/or correction information (e.g., parity bits), while N rows and N columns are desirably associated with data of the data block. Values in positions (k,j) and (i,k) k=0, . . . , P−1 may be set to zero. At step 103, the (N+P)×(N+P) matrix $\Phi$ is divided into (L)×(L) sub-block matrices ("sub-blocks"), L a positive integer, where (N+P) divided by L yields an integer value with no remainder. For convenience, the following notation is employed: rows are numbered 0 to (N+P−1), columns are numbered 0 to (N+P−1), a position in the (N+P)×(N+P) matrix $\Phi$ is defined at the ith row and jth column as (i,j).

While matrix $\Phi$ is shown in the FIGS. as a 2-dimensional square matrix, the present invention is not so limited. The matrix $\Phi$ might be extended to more than 2-dimensions, with each dimension constructed in a manner similar to that of the two dimensions of the matrix $\Phi$ described herein.

Figures 2, 3:
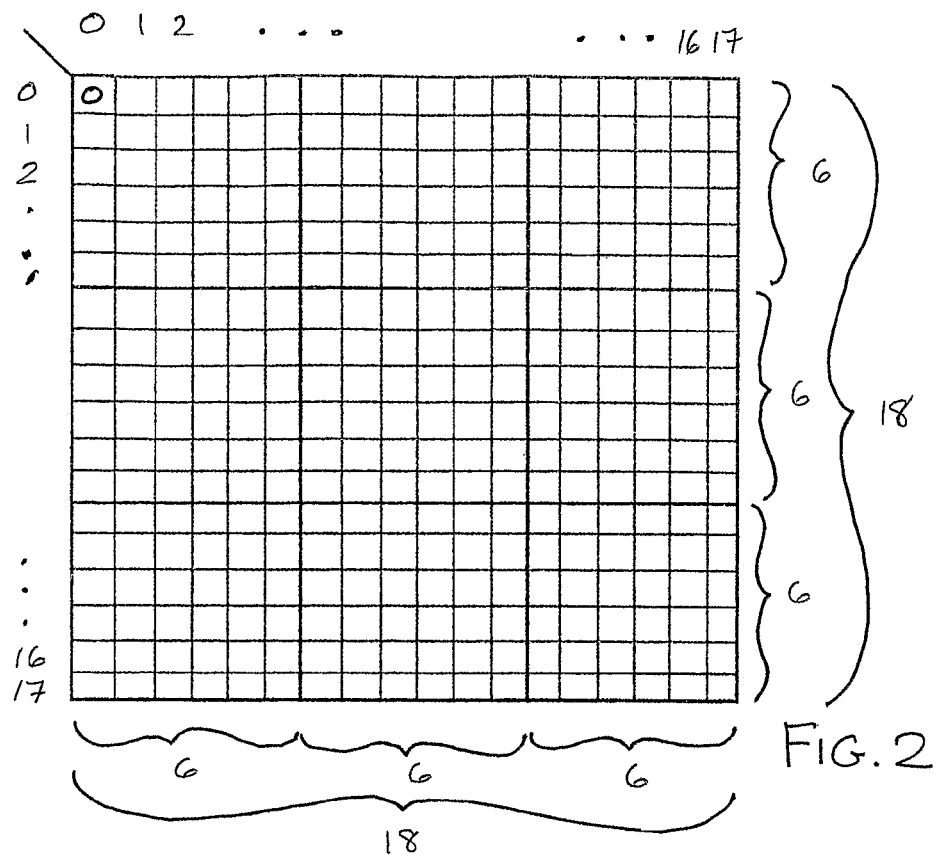
FIG. 2 shows a matrix formed in accordance with the method of FIG. 1.
FIG. 3 shows the matrix of FIG. 2 divided into sub-blocks and having portions associated with data and error detection/correction information.

FIG. 2 shows an exemplary (N+P)×(N+P) matrix $\Phi$ having nine sub-blocks (with borders indicated in the grid with heavier lines) formed in accordance with steps 101 and 102 of FIG. 1, where (N+P) is 18 and L is 6. FIG. 3 shows the matrix $\Phi$ of FIG. 2 where P=1. As shown in FIG. 3, parity bits are associated with positions in the first row and first column. The position (i=0, j=0) contains no information and is set to zero.

Nine sub-blocks are formed, labeled as SB(m,n), where $1 \leq n \leq 3$. Sub-blocks SB(1,n) and SB(m, 1) include spaces associated with parity bits and data bits, while the remaining sub-blocks include spaces associated only with data bits.

At step 104, in the (N+P)×(N+P) matrix Φ, positions (i,j) are generated in a time sequence. The position in the time sequence might be indicated by a numerical value, or sequence number, which might also be associated with a unit of time (e.g., the value at position 4 is received at T=4). Consequently, for a given position (i,j), the corresponding sequence number in the sequence of generated positions corresponds to a position in an output interleaved block. The output sequence of positions is generated on a sub-block by sub-block basis as follows.

For each sub-block SB(m,n), a row/column generator seed pair $\{a,b\}_{SB(m,n)}$ and an original position seed pair (ps1, ps2)$_{SB(m,n)}$ is assigned. If the matrix Φ is of greater dimension than 2, then the number of elements in the generator seed set and the number of elements in the original position seed set are equivalent and equal to the order of the matrix Φ's dimension. The a and b of generator seed pair $\{a,b\}$ correspond to row and column position increment values, respectively. Therefore, if a=1, then when an operation that calculates a new position i for (i,j) completes, i is then incremented by 1 (i.e., i=(i+1). Similarly, if b=1, then when an operation that calculates a new position j for (i,j) completes, j is then incremented by 1 (i. e., j=(j+1). When selecting values for a and b, a and b are desirably selected so as to be relatively prime to L. Values for a and b are desirably selected so as to be relatively unique for each sub-block. The original position seed pair (ps1,ps2)$_{SB(m,n)}$, (n-1)$\geq$ps1,ps2$\geq$0 is an initial start position in sub-block SB(m,n). Consequently, the first position (i,j) selected in sub-block SB(m,n) to begin calculation is (i=ps1, j=ps2). When selecting values for original position seed pair (ps1,ps2)$_{SB(m,n)}$, the values might be generated randomly or be predetermined. However, the positions in (k,j), and (i,k), k=0, . . . , P−1, are not selected (these position values are set to zero in sub-block SB(1,1)).

Given $\{a,b\}_{SB(m,n)}$ and (ps1,ps2)$_{SB(m,n)}$ for each sub-block SB(m,n), the row index i is generated as in equation (1), and the column index j is generated as in equation (2):

$$i = \mathrm{mod}(\mathrm{mod}(ps1,L)+\{k\}*a,L)+\mathrm{floor}(ps1,L)*L \quad (1)$$

$$j = \mathrm{mod}(\mathrm{mod}(ps2,L)+\{k\}*b,L)+\mathrm{floor}(ps2,L)*L, \quad (2)$$

where k varies from 0 to L−1. In equations (1) and (2), "mod(•)" is the mathematical modulus function, and floor (•) is the mathematical floor function (where floor (xy)=integer part of x divided by y). After positions (i,j) are generated for k=0 to L−1, L positions have been generated and ps1 is then updated as in equation (3):

$$ps1 = \mathrm{mod}(\mathrm{mod}(ps1,L)+1,L)+\mathrm{floor}(ps1,L)*L. \quad (3)$$

The value for ps2 remains constant.

After the value for ps1 is updated, equations (1) and (2) are again evaluated for k=0 to L−1 to generate another L positions. This process repeats for all positions in sub-block SB(m,n). The process of evaluating equations (1) and (2) with the initial calculation and calculations with ps1 updated L−1 times generates $L^2$ positions for the sub-block.

The time T each position (i,j) is generated for each sub-block also corresponds to a position in the output interleaved block. Thus, for example, generating the sequence of $L^2$ positions (i,j) for time T=1 to T=$L^2$ identifies the positions in matrix Φ whose values are inserted into the output interleaved block at time/position T=1 to T=$L^2$ (time units might equal positions in the output interleaved block because the output interleaved block is a one-dimensional sequence).

FIG. 4 shows an exemplary matrix formed in accordance with the method of FIG. 1 where N is three and P is one. In this case, each sub-block contains a single bit value. Evaluating equations (1), (2), and (3) as described above yields position (1,1) at time T=1, position (2,2) at time T=2, and so on as shown in FIG. 5. The value at position (0,0) is generally not included in the output interleaved block.

Figure 6:
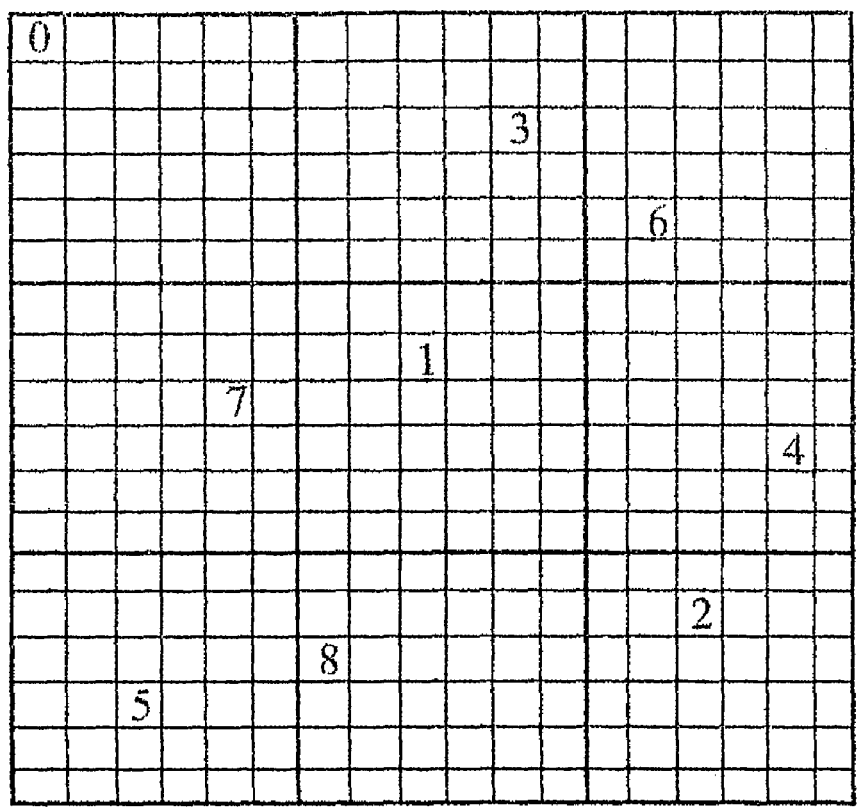
FIG. 6 shows an exemplary method of populating the matrix of FIG. 2.

Returning to FIG. 1, at step 105 the method fills the (N+P)×(N+P) matrix Φ with the data. Several methods might be employed to populate (associate) positions of the matrix Φ with the data bits. Each method of population might provide different performance in i) distributing, in the new matrix, bits that are adjacent to one another in the data block and/or ii) avoiding high-error bit patterns in the output block. For example, data bits might be inserted sequentially into positions of the first sub-block, then inserted sequentially into positions of the second sub-block, and so on until all sub-blocks are filled. Alternatively, FIG. 6 shows an exemplary method of populating the matrix of FIG. 2 where data bits in the input block sequence are sequentially inserted into the new matrix starting with the first position of the first sub-block, the first position of the second sub-block, and so on until all sub-block first positions are filled. Then, the data bits are sequentially inserted into the new matrix starting with the second position of the first sub-block, the second position of the second sub-block, and so on until all sub-block second positions are filled. This continues until all sub-blocks are filled.

Referring to the example of FIGS. 4 and 5, data bits b1 through b9 are inserted into the matrix as follows. Data bit values b1 through b3 are inserted at the positions identified for T=1 through T3. At T=4, however, the position in the matrix is associated with a parity bit (p1), so the position at T=4 is reserved for p1. Data bits b4 and b5 are then inserted into the positions at T=5 and T=6. The position at T=7 is associated with a parity bit (p6), so the position at T=7 is reserved for p6. The remaining data bits are inserted and remaining parity bits are reserved in a similar manner.

At step 106, the error detection and correction information (e.g., parity values) for each row and each column are generated and associated with the corresponding positions in the new matrix. At step 107, the values (e.g., parity or data bit values) associated with each position in the matrix Φ are read out in sequence to form an output interleaved block. The zero value at position (i=0, j=0) might be discarded rather than inserted into the output interleaved block.

Figure 7:
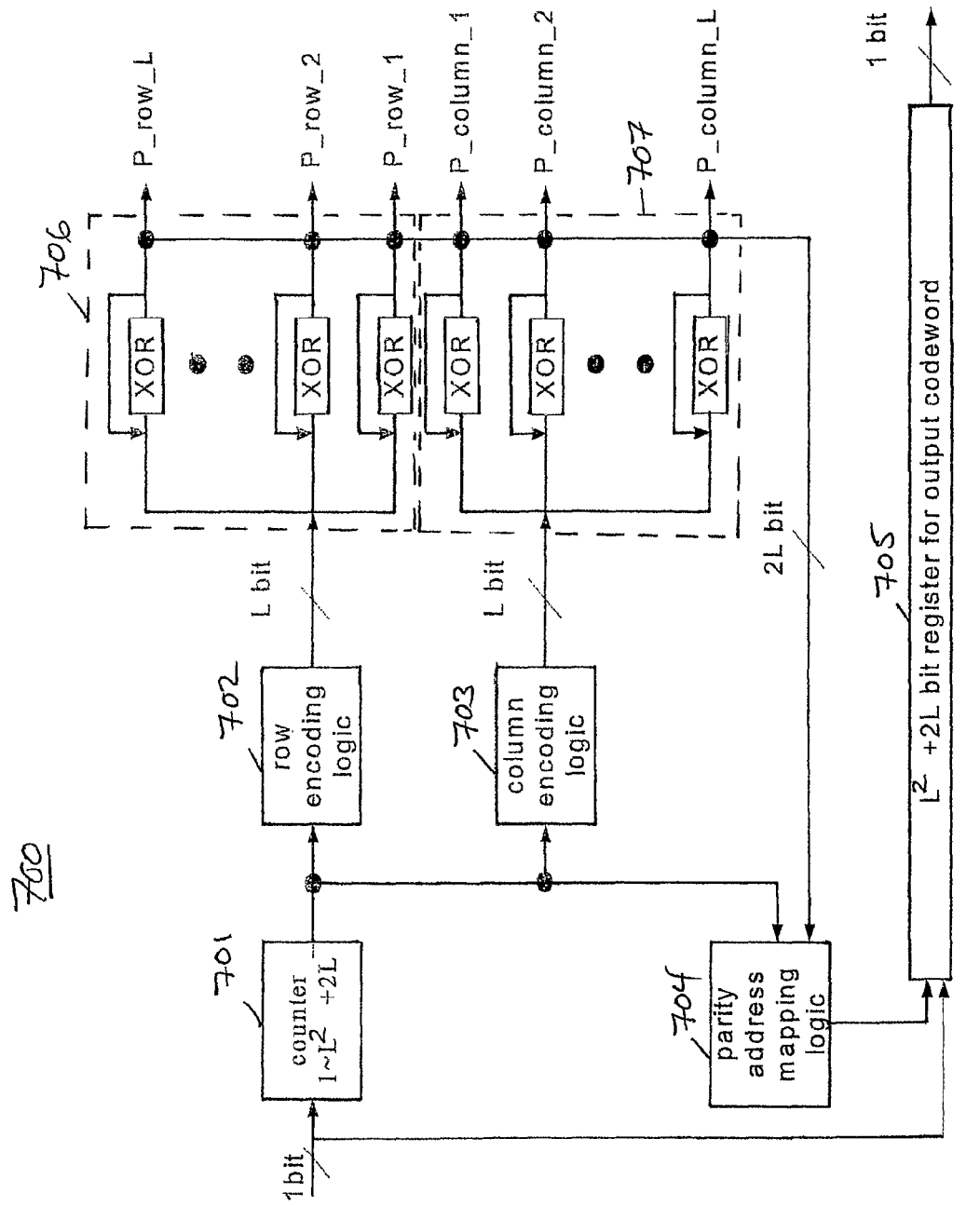
FIG. 7 shows an exemplary implementation of an interleaver operating in accordance with an exemplary embodiment of the present invention.

FIG. 7 shows an exemplary implementation of interleaver 700 operating in accordance with an exemplary embodiment of the present invention, where a=b=ps1=ps2=1 for a matrix having a sub-block of size $L^2$ (e.g., such as the example of FIGS. 4 and 5, where L=N=3, and P=1). Each data bit of the input data block is applied to counter 701 so that even though there are only $L^2$ data bits, it covers the range of counter 701 from 1 to $L^2$+2L. Counter 701 generates a mapped bit value whose position is determined by row encoding logic 702 and column encoding logic 703. Row parity check value calculator 706 generates a parity check value for each of the L rows of the matrix, and column parity check value calculator 707 generates a parity check value for each of the L columns of the matrix. The row and column parity check values, as well as the mapped bit position values, are applied to parity address mapping logic. Parity address mapping logic 704 then coordinates filling of register 705 (of length $L^2$+2L) with input data bits and row and column parity bit values in accordance with the mapped bit position values.

Figure 8:
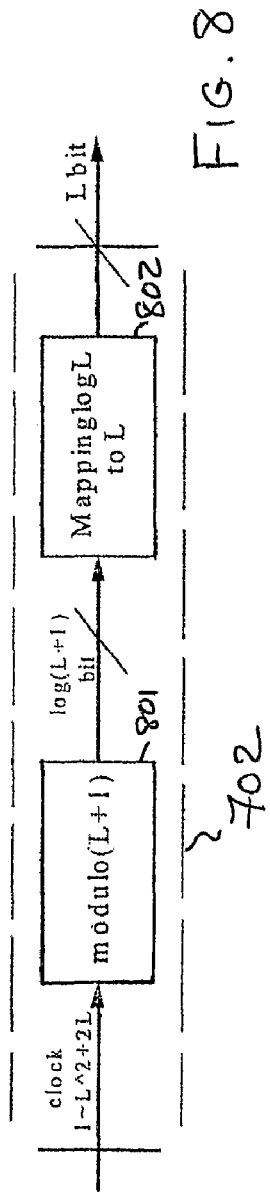
FIG. 8 shows the row encoding logic of FIG. 7.

FIG. 8 shows row encoding logic 702 of FIG. 7 employing modulo(L+1) calculator 801, which generates a log (L+1) bit, and Log L to L mapping module 802, which converts each log (L+1) bit to an L bit. For example, when L=3, if the output from calculator 801 is 1 (decimal), and b'01 in binary format after Log L to L mapping module 802, it is mapped to b'0001, with the first three 0's disabling outputs P_row_2, P_row_3, P_row_4 and the last 1 enabling output P_row_1 of parity check value calculator 706. Similarly, b'10 is mapped to b'0010 to only enable P_row_2, and b'11 is mapped to b'0100 to only enable P_row_3.

Figure 9:
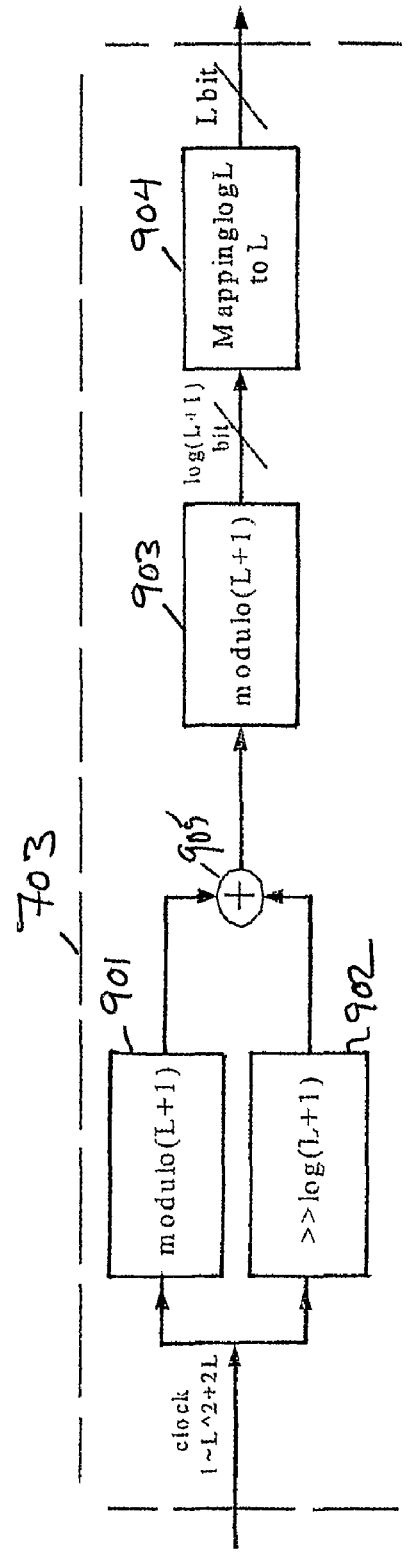
FIG. 9 shows the column encoding logic of FIG. 7.

FIG. 9 shows column encoding logic 703 of FIG. 7 employing modulo(L+1) calculator 901 and bit shifter Log (L+1) module 902. The outputs of modulo(L+1) calculator 901 and bit shifter Log (L+1) module 902 are combined in combiner 905, whose output is applied to modulo(L+1) calculator 901, which generates a log (L+1) bit. Each log (L+1) bit is converted to an L bit by Log L to L mapping module 904.

FIG. 10 shows transmitter 1000 including interleaver 1002 operating in accordance with an exemplary embodiment of the present invention. As shown in FIG. 10, transmitter 1000 includes data generator 1001 generating data blocks of length $N^2$ that are applied to interleaver 1002. Data generator 1001 might include an encoder generating the data block in accordance with a product code, or interleaver 1002 might embed an encoder in accordance with a product code. Interleaver 1002 generates an interleaved block by a mapping in accordance with an exemplary implementation of the present invention. The interleaved block is then employed by modulator 1003 to generate a modulated signal for transmission through a communication medium, such as a magnetic recording, an optical, or a wireless transmission medium.

FIG. 11 shows receiver 1100 including interleaver 1106 and de-interleavers 1102 and 1111 employing mapping and inverse mapping, respectively, in accordance with an exemplary embodiment of the present invention. Receiver 1100 might be employed to receive and decode a signal generated by transmitter 1000 of FIG. 10. Receiver 1100 generates samples y of a received signal that are applied to detector 1101. Detector 1101 might employ a soft output Viterbi algorithm (SOVA) to detect input symbols from the samples y, where the SOVA algorithm generates i) hard decisions (HDs) for the detected symbols and ii) corresponding reliability information (e.g., log likelihood ratios, or LLRs) for the soft decisions. HDs and reliability information (viewed as a priori reliability information, or soft decisions (SD)) are applied to de-interleaver 1102 to apply an inverse mapping to reverse the interleaving by interleaver 1002 of transmitter 1000. If data generator 1001 of transmitter 1001 employs product coding of K product codes, then the receiver might employ an iterative decoding method. Consequently, the HDs and reliability information are applied to a sequence of K soft decodings (one for each product code) implemented by soft decoders 1103(1) through 1103(K).

The output of soft decoder 1103(K) comprises a set of hard decisions (HDs) for decoded data, along with a corresponding set of reliability values for the HDs that are viewed as aposteriori reliability information. These HDs and aposteriori reliability values comprise the output of a first iteration of decoding. A second iteration of decoding is then implemented. The HDs and aposteriori reliability values are then interleaved in accordance with the same mapping employed by interleaver 1002 of transmitter 1000 so that the HDs and a posteriori reliability values align in sequence with the symbols of input samples y provided from delay 1009. The input samples y, interleaved HDs, and new a priori reliability values for the input samples are applied to detector 1108 (which might also detect in accordance with the SOVA algorithm). New a priori reliability values are generated (by combiner 1107) from the (a priori) LLRs from detector 1101 and the interleaved a posteriori reliability values from interleaver 1106.

Detector 1108 generates a new set of HDs for the input samples y, along with corresponding new reliability values. The new SDs are modified (in combiner 1110) by deleting the a priori reliability values generated from combiner 1107. The modified new reliability values and corresponding HDs are de-interleaved by de-interleaver 1111, which applies an inverse mapping similar to that of de-interleaver 1102. The de-interleaved reliability values (SDs) and corresponding HDs from de-interleaver 1111 are then subject to a second iterative decoding by soft decoders 1112(1) through 1112(K), which might decode in a manner similar to that described above for soft decoders 1103(1) through 1103(K). The output of soft decoder 1112(K) is a set of new HDs that are provided as the decoded data stream.

While the present invention has been described herein for generating a mapping using square matrices of 2 dimensions, the present invention is not so limited and may be extended to D dimensions where the length of each dimension may differ. Thus, if the data block is of length $$\prod_{d=1}^{D} N_d,$$

where each $N_d$ is a positive integer and the $N_d$'s are not necessarily equal, a matrix of D dimensions with dimension d having length $(N_d+P_d)$ may be generated. Similarly, each dimension need not be augmented by the same value P, but rather augmented by a corresponding value $P_d$, where $1 \leq d \leq D$. In addition, sub-blocks need not be square with lengths L, but rather $(L_1) \times (L_2)$ matrices (or of dimension length $L_d$, in higher dimensions). As would be apparent to one skilled in the art, the various equations described herein for the various embodiments are exemplary, and might be modified based on the particular matrix size, dimension, and sub-block size.

Interleaving in accordance with an exemplary implementation of the present invention may allow enhanced single and multiple bit error detection and correction for bursty channels. The general structure of designing the interleaving mapping allows for a given implementation to avoid certain error producing patterns, and allows relatively great flexibility to generate a mapping for an interleaver.

The present invention may be employed in any type of transmission system where data is passed through a communication medium or channel. The present invention may be employed for either magnetic or optical recording, or in wired/wireless/optical/non-optical networks.

As would be apparent to one skilled in the art, the various functions of the interleaver or de-interleaver might be implemented with circuit elements or may also be implemented in the digital domain as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

I claim:

1. In a signal-processing application, a method of interleaving bits of data block, the method comprising the steps of:
   a) associating, in accordance with a mapping values of the data block with a first set of positions of a matrix, the matrix having D dimensions, D an integer greater than 1, dimension d has length ($N_d+P_d$), and where $P_d$ is a positive integer, wherein each position of the matrix has a corresponding time sequence value and the data block has length $$\prod_{d=1}^{D} N_d;$$

b) generating error detection/correction information associated with a second set of positions of the matrix; and
   c) providing values at positions of the matrix in accordance with the time sequence values,
   wherein the mapping is defined by
   d) generating, for one or more sub-blocks of the matrix, a sequence of positions in the time sequence on a sub-block by sub-block basis based on a generator seed set and an original position seed set.

2. The invention as recited in claim 1, wherein, for step a), D is two, $P_1=P_2=P$, $N_1=N_2$, the matrix is a (N+P)×(N+P) square matrix and the data block is of length $N^2$ and, for step d), each sub-block is an (L)×(L) matrix, and (N+P) divided by L is a positive integer.

3. The invention as recited in claim 2, wherein, for step d), the sequence of positions are generated with generator seed set $\{a,b\}_{SB(m,n)}$ and original position seed set $(ps1,ps2)_{SB(m,n)}$ for each sub-block SB(m,n), and the row index i the column index j of each position is generated as:

i=mod(mod(*ps1*,L)+{k}*a,L)+floor(*ps1*,L)*L)

j=mod(mod(*ps2*,L)+{k}*b,L)+floor(*ps2*,L)*L), where k varies from 0 to L−1, "mod(•)" is a mathematical modulus function, and floor(•) is a mathematical floor function, and ps1 is then updated as:

*ps1*=mod(mod(*ps1*,L)+1,L)+floor(*ps1*,L)*L).).

4. The invention as recited in claim 3, wherein step d) comprises the step of selecting values for a and b so as to be relatively prime to L and so as to be relatively unique for each sub-block.

5. The invention as recited in claim 1, wherein step d) comprises the step of selecting values for the generator seed set so as to be relatively prime to a corresponding sub-block dimension length $L_d$, where each sub-block is a (L)×(L) matrix and $L_d$ is a positive integer, and so as to be relatively unique for each sub-block.

6. The invention as recited in claim 1, wherein, for step a), the error detection/correction information comprises row-wise and column-wise parity bits, and step d) comprises the step of setting one or more initial row and column position values to zero.

7. The invention as recited in claim 1, wherein step a) associates values of the data block based on the sub-blocks of the matrix.

8. The invention as recited in claim 7, wherein step a) associates values of the data block based on the sequence of positions for each sub-block of the matrix in a predefined order of sub-blocks.

9. The invention as recited in claim 7, wherein step a) associates values of the data block based on the sequence of positions for each sub-block of the matrix in a predefined order of position numbers for each sub-block.

10. The invention as recited in claim 1, wherein the method is implemented by a processor embodied in an integrated circuit.

11. In a signal-processing application, a method of de-interleaving an interleaved, encoded block of data after passing as a signal through a communications channel, comprising the steps of
    (a) detecting a set of values representing the interleaved, encoded block of data;
    (b) de-interleaving the interleaved, encoded block of data in accordance with an inverse of a mapping, wherein the encoded block of data is interleaved by the steps of:
    c1) associating values of a data block having length $$\prod_{d=1}^{D} N_d,$$

each $N_d$ a positive integer, with a first set of positions of an matrix in accordance with the mapping, wherein:
      i) each position of the matrix has a corresponding time sequence value
      ii) the matrix has D dimensions, D an integer greater than 1, with dimension d having length ($N_d+P_d$) and where $P_d$ is a positive integer, and
      iii) the mapping is defined by the step of generating, for one or more sub-blocks of the matrix, a sequence of positions in the time sequence on a sub-block by sub-block basis based on a generator seed set and an original position seed set;
    c2) generating error detection/correction information associated with a second set of positions of the matrix; and
    c3) providing values at positions of the matrix in accordance with the time sequence values to form the interleaved block of encoded data.

12. The invention as recited in claim 11, wherein the method is implemented by at least one processor embodied in an integrated circuit.

13. For a signal-processing application, a circuit for interleaving bits of data block having length $$\prod_{d=1}^{D} N_d,$$

each $N_d$ a positive integer, into an encoded data block, the circuit comprising:
- a first circuit adapted to apply a mapping to elements of the data block by associating values of the data block with a first set of positions of a matrix, the matrix having D dimensions, D an integer greater than 1, dimension d has length ($N_d+P_d$), and where $P_d$ is a positive integer, wherein each position of the matrix has a corresponding time sequence value; and
- a second circuit adapted to generate error detection/correction information associated with a second set of positions of the matrix; and
- a third circuit adapted to provide values at positions of the matrix in accordance with the time sequence values,
wherein the mapping is defined by generating, for one or more sub-blocks of the matrix, a sequence of positions in the time sequence on a sub-block by sub-block basis based on a generator seed set and an original position seed set.

14. The invention as recited in claim 13, wherein D is two, $P_1=P_2=P$, $N_1=N_2$, the matrix is a $(N+P)\times(N+P)$ square matrix and the data block is of length $N^2$, each sub-block is an L×L matrix, and (N+P) divided by L is a positive integer.

15. The invention as recited in claim 14, wherein the sequence of positions are generated with generator seed set $\{a,b\}_{SB(m,n)}$ and original position seed set $(ps1,ps2)_{SB(m,n)}$ for each sub-block SB(m,n), and the row index i the column index j of each position is generated as:

$i$=mod(mod($ps1,L$)+$\{k\}*a,L$)+floor($ps1,L$)*$L$)

$j$=mod(mod($ps2,L$)+$\{k\}*b,L$)+floor($ps2,L$)*$L$), where k varies from 0 to L−1, "mod(•)" is a mathematical modulus function, and floor(•) is a mathematical floor function, and ps1 is then updated as:

$ps1$=mod(mod($ps1,L$)+1,$L$)+floor($ps1,L$)*$L$).).

16. The invention as recited in claim 15, wherein values for a and b are selected so as to be relatively prime to L and so as to be relatively unique for each sub-block.

17. The invention as recited in claim 15, wherein values for the generator seed set are selected so as to be relatively prime to the length L, where each sub-block is a L×L matrix and L is a positive integer, and values for the generator seed set are selected so as to be relatively unique for each sub-block.

18. The invention as recited in claim 13, wherein the error detection/correction information comprises row-wise and column-wise parity bits, and one or more initial row and column position values are set to zero.

19. The invention as recited in claim 13, wherein the first circuit associates values of the data block based on the sub-blocks of the matrix.

20. The invention as recited in claim 19, wherein the first circuit associates values of the data block based on the sequence of positions for each sub-block of the matrix in a predefined order of sub-blocks.

21. The invention as recited in claim 19, wherein the first circuit associates values of the data block based on the sequence of positions for each sub-block of the matrix in a predefined order of position numbers for each sub-block.

22. The invention as recited in claim 13, wherein the circuit is embodied in an integrated circuit.

23. For a signal-processing application, a circuit having a decoder decoding an interleaved, encoded block of data, comprising:
- a detector adapted to detect a set of values representing the interleaved, encoded block of data;
- a de-interleaver adapted to de-interleave the interleaved, encoded block of data in accordance with an inverse of a mapping, wherein the encoded block of data is interleaved by:
  1) associating values of a data block having length $$\prod_{d=1}^{D} N_d,$$

$N_d$ a positive integer, with a first set of positions of a matrix in accordance with the mapping, wherein:
   i) each position of the matrix has a corresponding time sequence value
   ii) the matrix has D dimensions, D an integer greater than 1, with dimension d having length ($N_d+P_d$), and where $P_d$ is a positive integer, and
   iii) the mapping is defined by the step of generating, for one or more sub-blocks of the matrix, a sequence of positions in the time sequence on a sub-block by sub-block basis based on a generator seed set and an original position seed set;
  2) generating error detection/correction information associated with a second set of positions of the matrix; and
  3) providing values at positions of the matrix in accordance with the time sequence values to form the interleaved block of encoded data.

24. The invention as recited in claim 23, wherein the circuit is embodied in an integrated circuit.

* * * * *

UNITED STATES PATENT AND TRADEMARK OFFICE
CERTIFICATE OF CORRECTION

PATENT NO. : 7,640,462 B2  Page 1 of 1
APPLICATION NO. : 10/592882
DATED : December 29, 2009
INVENTOR(S) : Xiaotong Lin It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 504 days.

Signed and Sealed this

Twenty-first Day of December, 2010

David J. Kappos
*Director of the United States Patent and Trademark Office*